(12) United States Patent
Kawaguchi et al.

(10) Patent No.: US 9,493,870 B2
(45) Date of Patent: Nov. 15, 2016

(54) RADIO WAVE-TRANSMITTING DECORATIVE FILM AND DECORATIVE MEMBER USING SAME

(75) Inventors: Toshiyuki Kawaguchi, Tokyo (JP); Kazutoki Tahara, Saitama (JP); Tsutomu Saga, Saitama (JP)

(73) Assignee: SHIN-ETSU POLYMER CO., LTD. (JP)

(*) Notice: Subject to any disclaimer, the term of this patent is extended or adjusted under 35 U.S.C. 154(b) by 198 days.

(21) Appl. No.: 13/256,643

(22) PCT Filed: Mar. 15, 2010

(86) PCT No.: PCT/JP2010/001826
§ 371 (c)(1),
(2), (4) Date: Sep. 15, 2011

(87) PCT Pub. No.: WO2010/106778
PCT Pub. Date: Sep. 23, 2010

(65) Prior Publication Data
US 2012/0064353 A1  Mar. 15, 2012

(30) Foreign Application Priority Data
Mar. 17, 2009 (JP) .............................. P2009-064568

(51) Int. Cl.
*B32B 9/04* (2006.01)
*C23C 14/20* (2006.01)
*B32B 27/08* (2006.01)

(52) U.S. Cl.
CPC ............... *C23C 14/20* (2013.01); *B32B 27/08* (2013.01); *B32B 2250/24* (2013.01);
(Continued)

(58) Field of Classification Search
None
See application file for complete search history.

(56) References Cited

U.S. PATENT DOCUMENTS 4,397,989 A * 8/1983 Adesko .......................... 525/162
5,656,355 A * 8/1997 Cohen ............................ 428/138
(Continued)

FOREIGN PATENT DOCUMENTS

EP  1548148 A1  6/2005
JP  58-084233     6/1983
(Continued)

OTHER PUBLICATIONS

Shingyouchi, JP2002135030 machine translation. May 10, 2002.*
(Continued)

*Primary Examiner* — Coris Fung
(74) *Attorney, Agent, or Firm* — Ostrolenk Faber LLP

(57) ABSTRACT

Disclosed are a low-cost radio wave-transmitting decorative film which has excellent stretch moldability, radio wave transmissibility, and mirror-like metallic gloss that does not easily disappear, and a decorative member employing the radio wave-transmitting decorative film. Specifically disclosed are a decorative film which includes a first polymer film, a second polymer film, and a light-reflecting layer which is arranged between the polymer films and formed by the physical vapor deposition of an alloy of silicon and a metal, and a decorative member in which the decorative film is provided on the surface of a base.

14 Claims, 7 Drawing Sheets

(52) U.S. Cl.
CPC ...... *B32B 2255/10* (2013.01); *B32B 2255/205* (2013.01); *B32B 2307/416* (2013.01)

(56) References Cited

U.S. PATENT DOCUMENTS

| | | | | |
|---|---|---|---|---|
| 6,103,390 | A | * | 8/2000 | Kamiya et al. ............ 428/542.2 |
| 6,132,817 | A | * | 10/2000 | Tokutake et al. ............. 427/578 |
| 7,223,641 | B2 | | 5/2007 | Maekawa ..................... 438/149 |
| 8,492,968 | B2 | | 7/2013 | Nakamura ................... 313/504 |
| 2002/0113922 | A1 | * | 8/2002 | Kusumoto et al. ............ 349/96 |
| 2003/0161997 | A1 | * | 8/2003 | Moran .......................... 428/172 |
| 2009/0058283 | A1 | * | 3/2009 | Tanaka et al. ................ 313/504 |
| 2009/0197045 | A1 | * | 8/2009 | Okada ...................... C22C 5/06 428/141 |
| 2009/0258234 | A1 | | 10/2009 | Chiang et al. ................ 428/412 |
| 2010/0015400 | A1 | * | 1/2010 | Tokuchi .................. B32B 27/30 428/172 |
| 2010/0207842 | A1 | * | 8/2010 | Kawaguchi et al. ......... 343/907 |

FOREIGN PATENT DOCUMENTS

| | | |
|---|---|---|
| JP | 08-031569 | 2/1996 |
| JP | A-2002-065873 | 3/2002 |
| JP | 2002-135030 | 5/2002 |
| JP | A-2002-173340 | 6/2002 |
| JP | 3414717 | 6/2003 |
| JP | 2004-018946 | 1/2004 |
| JP | 2004-103695 | 4/2004 |
| JP | B-3602861 | 12/2004 |
| JP | 2005-249773 | 9/2005 |
| JP | 2006-276008 | 10/2006 |
| JP | 2006-282886 | 10/2006 |
| JP | 2007-285093 | 11/2007 |
| JP | 2008-038249 | 2/2008 |
| JP | 2008-200861 | 9/2008 |
| JP | 2008-207337 | 9/2008 |
| WO | WO 2006129482 A1 * | 12/2006 |
| WO | WO 2008/020482 A1 | 2/2008 |
| WO | WO 2008050738 A1 * | 5/2008 |

OTHER PUBLICATIONS

DuPont, Hytrel thermoplastic polyester elastomer—the first 2 cover pages, pp. 1, 3 5 and 6 and the last page of the document. 2000. http://www2.dupont.com/Plastics/en_US/assets/downloads/processing/H81091.pd.*

Chen et al., Silicon-aluminium network composites fabricated by liquid metal infiltration, Journal of Materials Science, Jan. 1994, vol. 29, Issue 23, pp. 6069-6075. http://wings.buffalo.edu/academic/department/eng/mae/cmrl/Silicon-aluminum%20network%20composites%20fabricated.pdf.*

Search Report dated Jan. 30, 2013 issued in corresponding European Patent Application No. 10753275.6.

International Search Report and Written Opinion mailed Jun. 15, 2010 in corresponding PCT International Application No. PCT/JP2010/001826.

Surface Roughness (JIS B 0601-2001), Technical Information, p. R3, 2001.

Office Action dated Nov. 25, 2013 issued in corresponding U.S. Appl. No. 13/143,953.

International Search Report and Written Opinion mailed Apr. 6 2010 issued in corresponding PCT International Application No. PCT/JPZ010/000270.

Chinese Office Action and English language translation dated Apr. 24, 2013 issued in corresponding Chinese Patent Application No. 201080004798.7.

Search Report dated Apr. 12, 2013 issued in corresponding European Patent Application No. 10733341.1.

* cited by examiner

10nm

RADIO WAVE-TRANSMITTING DECORATIVE FILM AND DECORATIVE MEMBER USING SAME

CROSS-REFERENCE TO RELATED APPLICATIONS

The present application is a 35 U.S.C §371 national phase conversion of PCT/JP2010/001826, filed Mar. 15, 2010, which claims priority of Japanese Patent Application No. 2009-064568, filed Mar. 17, 2009, the contents of which are incorporated herein by reference. The PCT International Application was published in the Japanese language.

TECHNICAL FIELD

The present invention relates to a radio wave-transmitting decorative film having metallic gloss and a decorative member using the same.

BACKGROUND ART

From the viewpoint of design properties, metallic decorative members, in particular, decorative members having a mirror-like metallic gloss have been widely used in the casing of a mobile phone; the button of a switch; the casing of a watch; and the radiator grill, bumper, panel or the like of a vehicle.

As such decorative members, a decorative member that transmits radio waves (microwaves or the like) without adversely affecting the radio waves has been required for the following reasons:

(i) An antenna for transmitting and receiving radio waves is disposed inside the casing of a mobile phone.

(ii) An antenna for receiving radio waves is disposed inside the casing of a radio controlled clock that is provided with functions of receiving standard waves and of automatically correcting errors.

(iii) In a vehicle equipped with a radar device that detects the presence of obstacles or measures the distance between vehicles, and the like, the antenna of the radar device is disposed in the vicinity of a radiator grill or a bumper.

(iv) The frequency of radio waves used in communication devices (wireless PAN such as Bluetooth, UWB, and Zig-Bee) has been shifting to a high frequency range of from millimeter waves to microwaves, at which radio waves are readily affected by the decorative members, and thus these devices are prone to functional disorders.

For example, the decorative member can be prepared by providing a decorative film having radio wave transmissibility on the surface of a base of a decorative member. The following materials have been proposed as the decorative film and a decorative member.

(1) A decorative film and a mobile device having a vapor deposited film of indium or tin on the back surface of transparent resin film (refer to PTL 1).

(2) A decorative film including laminated film with a visible light reflectance of 30% or more where two or more kinds of resin layers are alternately laminated 30 times or more, and the number of layers having a wavelength of equal to or greater than 10 nm and less than 220 nm is more than the number of layers having a wavelength of 220 nm to 320 nm (PTL 2).

The decorative film in (1) has radio wave transmissibility and metallic gloss for the following reasons.

With respect to the metal-deposited film of indium or tin, it is known that because the metal is present as a minute independent island, a homogeneous metal layer can be recognized, which is observed visually, the size of one island is sufficiently smaller than the wavelength of radio waves which are passed through, and therefore radio waves can pass through.

The decorative film in (2) has radio wave transmissibility and metallic gloss for the following reasons.

A number of thin resin layers having different refractive indexes can be recognized as metallic luster, and therefore radio waves can pass through because a metal conductor is not used.

However, with respect to the decorative film of (1), if the thickness of the metal-deposited film is increased in order to attain a sufficient metallic gloss, and the islands become partially connected to each other due to the pressure applied to the metal-deposited film at secondary forming when a decorative member is produced, it forms a network that serves as a good conductor, and thus the reflection or absorption of radio waves occurs according to the frequency thereof. Therefore, as to whether a product using the decorative film of (1) does not impede the straightness of the radio waves, or other disorders do not occur, all of the products using the decorative film are required to be inspected, and therefore it has a low productivity. In addition, tin is prone to oxidation, chlorination, or the like, as a result of which the metallic gloss thereof is lost over time. On the other hand, indium is not readily available and highly expensive.

The decorative film of (2) has a low productivity and the high cost of a laminated film. In addition, the heating stretch moldability is deteriorated and therefore the decorative film cannot be formed into a desirable shape. Further, through hot forming, the refractive index of the decorative film and the balance of the respective layers are changed, and therefore a loss of metallic gloss occurs.

CITATION LIST

Patent Literature

[PTL 1] Japanese Patent Application Laid-Open No. 2007-285093

[PTL 2] Japanese Patent Application Laid-Open No. 2008-200861

SUMMARY OF INVENTION

Technical Problem

The invention provides a radio wave-transmitting decorative film which has radio wave transmissibility, a mirror-like metallic gloss which does not easily disappear, excellent stretch moldability, and low cost, and a decorative member using the same.

Solution to Problem

The radio wave-transmitting decorative film of the invention is characterized by including a first polymer film; a second polymer film; and a light-reflecting layer which is formed by physical vapor deposition of an alloy of silicon and a metal, which is disposed between the first polymer film and the second polymer film.

The metal preferably has a larger reflectance than that of silicon.

The metal is preferably aluminum.

It is preferable that the radio wave-transmitting decorative film of the invention further include an adhesion promoting layer which is arranged between the first polymer film or the second polymer film and the light-reflecting layer.

The decorative member of the invention is characterized by providing the radio wave-transmitting decorative film of the invention on the surface of a base.

Advantageous Effects of Invention

The radio wave-transmitting decorative film of the invention has radio wave transmissibility, a mirror-like metallic gloss which does not easily disappear, excellent stretch moldability, and low cost.

The decorative member of the invention has radio wave transmissibility, a mirror-like metallic gloss which does not easily disappear, an excellent external appearance in a portion where the decorative film of the corner portion is stretched, and low cost.

DESCRIPTION OF EMBODIMENTS

The term "light" used in the present invention refers to visible light.

The term "radio wave" in the invention refers to electromagnetic waves having a frequency ranging from 10 MHz to 1,000 GHz (from submillimeter waves to microwaves).

The term "transparency" in the invention refers to optical transmissibility.

First Embodiment

Figure 1:
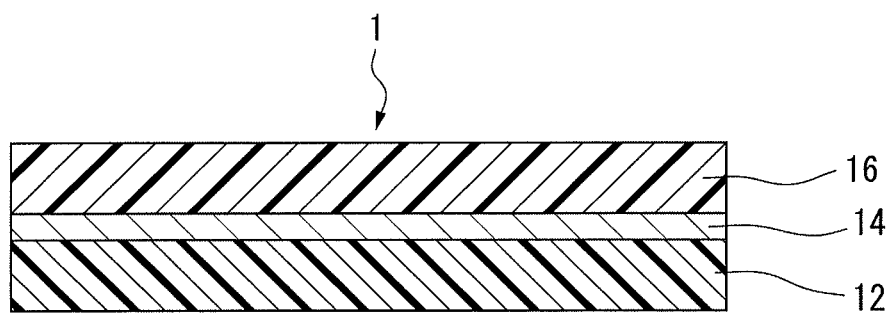
FIG. 1 is a cross-sectional view showing one example of the radio wave-transmitting decorative film of the invention.

FIG. 1 is a cross sectional view showing an example of the radio wave transmitting decorative film (hereinafter, simply referred to as decorative film) according to the present invention. The decorative film 1 includes a first polymer film 12, a light-reflecting layer 14 provided on the surface of the first polymer film 12, and a second polymer film 16 provided on the surface of the light-reflecting layer 14.

Polymer Film

A first polymer film 12 and a second polymer film 16 (hereinafter, referred to as a polymer film) are films having radio wave transmissibility.

At least one of the first polymer film 12 and second polymer film 16 is required to be a transparent film. The transmittance to visible light of the transparent polymer film is preferably 80% or more.

The thickness of the polymer film is preferably 10 to 100 μm from the viewpoint of moldability of the decorative film 1. The thickness of the decorative film is preferably 20 to 150 μm.

Examples of the polymer film materials include polyolefin (polyethylene, polypropylene, an ethylene-propylene copolymer, an ethylene-vinyl acetate copolymer, or the like), cyclic polyolefin, modified polyolefin, polyvinyl chloride, polyvinylidene chloride, polystyrene, polycarbonate, poly-(4-methylpentene-1), an ionomer, an acrylic resin (polymethylmethacrylate, or the like), an acrylonitrile-butadiene-styrene copolymer (an ABS resin), an acrylonitrile-styrene copolymer (an AS resin), a butadiene-styrene copolymer, polyester (polyethylene terephthalate, polybutylene terephthalate, polycyclohexane terephthalate, or the like), polyphenylene oxide, modified polyphenylene oxide, polysulfone, polyether sulfone, polyvinylidene fluoride, unsaturated polyester, a silicone-based resin, and a urethane-based resin, and the like.

One type of the polymer film materials may be used singly, or two or more types thereof may be combined and used as a copolymer, a blended product, a polymer alloy, or the like.

Examples of the polymer film preferably include polycarbonate, polymethylmethacrylate, an AS resin, polystyrenes, cyclic polyolefins, polyethylene terephthalate, polybutylene terephthalate, and a modified product and a copolymer thereof and the like, from the viewpoint of transparency, strength, and moisture permeability, The polymer film materials preferably have the same materials as bases, from the viewpoint of incorporation with a base of a decorative member. Further, the polymer film may use a film having adhesive properties to the base of a decorative member.

As the polymer film, a plurality of the polymer films may be laminated. During lamination, thermosetting adhesives or thermoplastic adhesives may be used.

These polymer films may contain an additive if necessary. Examples of the additive include a strengthening agent, an antioxidant, an ultraviolet absorber, a lubricant, an anti-clouding agent, anti-fogging agent/misting agent, a plasticizer, a pigment, a near infrared absorber, an antistatic agent, and a colorant.

Light-Reflecting Layer

The light-reflecting layer 14 is formed by a physical vapor deposition of an alloy of silicon and a metal.

When using an alloy composed of silicon and a metal, the reflectance and brightness of the light-reflecting layer 14 are improved, as compared to the case where silicon is used alone, and thus a bright light-reflecting layer 14 can be obtained. In addition, because the alloy is soft compared to silicon, internal stress of the light-reflecting layer 14 is reduced, thereby improving the adhesiveness with the first polymer film 12 and suppressing the occurrence of cracks.

Silicon is a semiconductor material, unlike the metals described later. Silicon has the following properties, and thus is preferable in comparison to other semiconductor materials:

(i) High reflectance and brightness (ii) Because of low conductivity, the proportion of a metal in an alloy composed of silicon and the metal can be increased, so that a light-reflecting layer 14 can be obtained which is brighter while maintaining radio wave transmissibility, and internal stress in the light reflecting layer can be reduced.

(iii) Easy of Availability

Silicon may contain impurities which do not act as dopants, as long as the surface resistivity of the light-reflecting layer 14 can be maintained at a high level.

It is preferable that silicon contains as few dopants (such as boron, phosphorus, arsenic and antimony) as possible. The amount of dopants is preferably 1 ppm or less, and more preferably 10 ppb or less.

As the metal, a metal exhibiting a reflectance of 50% or higher is preferable. Examples of the metal include gold, silver, copper, aluminum, platinum, iron, nickel, and chromium, and the like, and aluminum and silver are preferred from the viewpoints of reflectance and cost, and aluminum is more preferable.

The term "reflectance" refers to the diffuse reflectance including regular reflectance which is measured in accordance with condition d (n-D) of JIS Z 8722. The reflectance is measured including the regular reflection light of a gloss component using an integrating sphere and is calculated as an average of measured values across the visible light region, which ranges from the short wavelength side (i.e., 360 nm to 400 nm) to the long wavelength side (i.e., 760 nm to 830 nm).

The proportion of the metal within the alloy (which is 100% in terms of volume) is preferably within a range from 0.1 to 70 volume %, and more preferably within a range from 40 to 70 volume %. When the proportion of the metal is 0.1 volume % or more, brightness of the light-reflecting layer 14 increases and internal stress of the light-reflecting layer 14 also reduces. When the proportion of the metal is 70 volume % or less, radio wave transmissibility improves even further.

The alloy may contain impurities other than silicon and metals, as long as the surface resistivity and metallic gloss of the light-reflecting layer 14 can be maintained at a high level.

The thickness of the light-reflecting layer 14 is preferably within a range from 10 to 500 nm, and more preferably within a range from 50 to 200 nm. When the thickness of the light-reflecting layer 14 is 10 nm or more, it becomes difficult for light to pass therethrough, and thus a sufficient metallic gloss can be attained. When the thickness of the light-reflecting layer 14 is 500 nm or less, an increase in the electrical conductivity is suppressed, and thus a satisfactory level of radio wave transmissibility can be maintained. Moreover, increase in the internal stress of the light-reflecting layer 14 can be suppressed, thereby the warping and deformation of decorative members, occurrence of cracks, delamination or the like, can be suppressed.

When the light-reflecting layer 14 is thin, the light is passed through and the reflectance reduces, and thus a dark metallic gloss can be obtained. Therefore, brightness of the metallic gloss can be adjusted by changing the thickness of the light-reflecting layer 14.

The thickness of the light-reflecting layer 14 can be measured from high resolution microscopic images of the cross section of the light-reflecting layer 14.

The surface resistivity of the light-reflecting layer 14 is preferably $10^3 \Omega$ or higher, more preferably $10^6 \Omega$ or higher. When the surface resistivity of the light-reflecting layer 14 is $10^3 \Omega$ or higher, a satisfactory level of radio wave transmissibility can be maintained.

The surface resistivity of the light-reflecting layer 14 is measured by a four-pin probe method in accordance with JIS K7194.

The average surface roughness of the light-reflecting layer 14 is preferably 0.05 μm or less. When the average surface roughness of the light-reflecting layer 14 is 0.05 μm or less, irregular reflection is suppressed, and thus a sufficient metallic gloss can be attained. The lower limit for the average surface roughness of the light-reflecting layer 14 is set to 0.1 nm, which can be achieved with a polishing process.

The average surface roughness of the light-reflecting layer 14 refers to an arithmetic average roughness Ra determined in accordance with JIS B 0601-2001. Specifically, a surface profile of the light-reflecting layer is measured by an atomic force microscope, and a reference length is extracted in the direction of the average line, followed by the determination of an average value (i.e., arithmetic average roughness Ra) derived from the sum of the absolute values of deviations ranging from the average line in which the reference length is extracted, to the roughness curve.

The average surface roughness of the light-reflecting layer 14 is affected by the average surface roughness of the first polymer film 12. Therefore, the average surface roughness of the first polymer film 12 is preferably 0.5 μm or less, and more preferably 0.1 μm or less. When the average surface roughness is 0.5 μm or less, even though the light-reflecting layer 14 is thin, the light-reflecting layer is dependent on the surface of the first polymer film 12, and thus a sufficiently mirror-like metallic gloss is attained.

The average surface roughness of the first polymer film 12 refers to an arithmetic average roughness Ra determined in accordance with JIS B 0601-2001.

The light-reflecting layer may be provided on both sides of the first polymer film. At this time, one side of the light-reflecting layer is thin so that flexibility can be increased, and metallic gloss can be increased.

The light-reflecting layer 14 is formed by physical vapor deposition of an alloy of silicon and a metal.

The physical vapor deposition process is a method for forming a thin film by vaporizing an evaporation material (an alloy) in a vacuum vessel in some way and then depositing the vaporized evaporation material on top of the substrate placed nearby, and the process can be classified into an evaporation system and a sputtering system, depending on the method for vaporizing an evaporation material. Examples of the evaporation system include an electron beam (EB) deposition process, an ion plating process, and a pulse laser deposition process and examples of the sputtering system include a radiofrequency (RF) sputtering process, a magnetron sputtering process, an opposite target type magnetron sputtering process, and ECR sputtering, and the like.

Although an EB deposition process tends to form a porous film having an unsatisfactory level of film strength, it is characterized in that damage inflicted on the substrate is minimal. An ion plating process is preferred because a film having an intense adhesive force can be obtained. A magnetron sputtering process is preferred because a film can be grown at a high growth rate, an opposite target type magnetron sputtering process is preferred because a thin film can be formed without causing plasma damage to the substrate, and an RF sputtering process is preferred because a target (evaporation material) with high resistance can be used.

Figure 2:
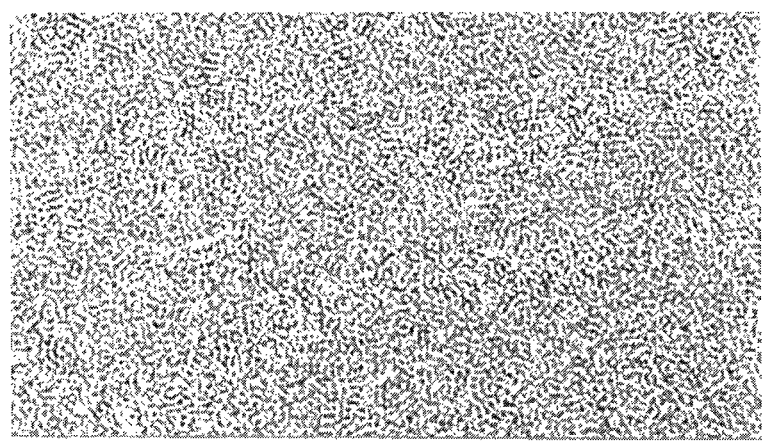
FIG. 2 is a high resolution transmission electron microscope image of the cross-section of a light-reflecting layer.
Figure 2:

FIG. 2 is a high resolution transmission electron microscope image of the surface of a light-reflecting layer formed by a DC magnetron sputtering process using a silicon-aluminum alloy. It can be seen that unlike the assembly of independent islands (microclusters) observed in conventional cases where indium, tin, or the like is used, no gap is present where the alloy is absent, as a result of which a continuous layer having a homogeneous amorphous structure is formed.

Second Embodiment

Figure 3:
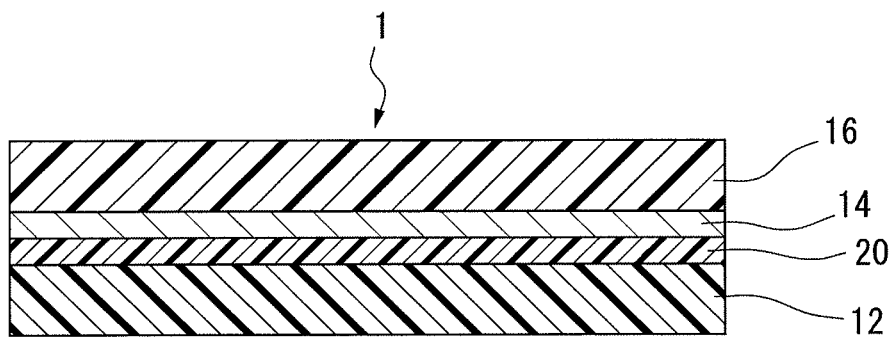
FIG. 3 is a cross-sectional view showing another example of the radio wave-transmitting decorative film of the invention.

FIG. 3 is a cross sectional view showing another example of a radio wave transmitting decorative film according to the present invention. A decorative film 1 includes a first polymer film 12, an adhesion promoting layer 20 provided on the surface of the first polymer film 12, a light-reflecting layer 14 provided on the surface of the adhesion promoting layer 20, and a second polymer film 16 provided on the surface of the light-reflecting layer 14.

In the second embodiment, the same configurations as in the first embodiment have the same references, the description of which will be omitted.

Adhesion Promoting Layer

In order to improve the adhesiveness between the polymer film and the light-reflecting layer 14, the adhesion promoting layer 20 is previously formed on the surface of the polymer film before forming the light-reflecting layer 14 or on the surface of the light-reflecting layer 14 after forming the light-reflecting layer 14.

The materials for the adhesion promoting layer 20 preferably have radio wave transmissibility or optical transparency, and adhesive force to polymer film, and is capable of forming covalent, coordination, or hydrogen bonds to the light-reflecting layer. The materials include an adhesion promoter, an inorganic matter, and a composite of an adhesion promoter and an inorganic matter, and the like.

The adhesion promoting layer 20 includes (a) a layer formed of adhesion promoters, (b) a layer formed of inorganic matter, (c) a layer formed of composite of adhesion promoters and inorganic matter, (d) a layer formed by performing a physical or chemical surface treatment on the surface of the polymer film, and the like.

(a) The adhesion promoter includes a resin (hereinafter, referred to as polar resin) having a polar bond (ester bond, urethane bond, allophanate bond, urea bond, burette bond, amide bond, and the like) or a polar group (a hydroxyl group, a carboxyl group, an amino group, an isocyanate group, an oxazoline group, a mercapto group, an epoxy group, and the like), in the main chain or a side chain.

Examples of the polar resin include nitrocellulose, acrylic resin, urethane resin, polyphosphazene, polyamide, epoxy resin, and the like.

The adhesion promoter may further contain a silane coupling agent. Examples of the silane coupling agent include vinyltriethoxysilane, vinyltris(2-methoxyethoxy)silane, 3-methacryloxypropyltrimethoxysilane, 3-glycidoxypropyltrimethoxysilane, 2-(3,4-epoxycyclohexyl)ethyltrimethoxysilane, N-2-(aminoethyl)-3-aminopropyltrimethoxysilane, N-2-(aminoethyl)-3-aminopropylmethydimethoxysilane, 3-aminopropyltriethoxysilane, N-phenyl-3-aminopropyltrimethoxysilane, 3-mercaptopropyltrimethoxysilane, 3-chloropropyltrimethoxysilane, cyanoethyltrimethoxysilane, cyanopropyltrimethoxysilane, and the like.

Transparent colorants such as dyes and pigments, and the like are blended with the adhesion promoter, which may have a function as a transparent coloring layer in combination. The transparent coloring layer regulates the brightness and saturation of metallic gloss, and thus can provide a design property.

(b) Examples of the inorganic matter include metal oxide, and preferably silicon oxide or titanium oxide. The metal oxide preferably has a particle shape. The average particle diameter of the metal oxide is preferably 5 to 1000 nm.

(c) Composites of the adhesion promoter and inorganic matter include (c1) metal oxide blended with an adhesion promoter, (c2) an organic and inorganic hybrid where metal alkoxide is blended with an adhesion promoter, followed by dealcohol condensation, and thus metal oxide is aggregated and precipitated in the adhesion promoter, and (c3) an organic and inorganic hybrid where polar resin (epoxy resin, acrylic resin, polyamide, or the like) having a metal alkoxy group in a side chain is subjected to dealcohol condensation and thus metal oxide is aggregated and precipitated in a polar resin, and the like. From the viewpoint of covalent bonding of a metal oxide and a polar resin as an adhesion promoter, (c3) is preferable. From the viewpoint of capability of forming covalent bonds with the light-reflecting layer 14, dealcohol condensation is preferably performed after forming the light-reflecting layer 14. After the surface of the polymer film is previously subjected to a hydrophilic process (chemical conversion treatment by chemicals, corona discharge treatment, UV radiation, oxygen plasma treatment, ITRO treatment, and the like), metal oxide is aggregated and precipitated by dealcohol condensation, metal oxide can be disposed across the whole surface of the polymer film to improve adhesive force and reflectance.

A proportion of the metal oxide in the composite is preferably 15 to 70% by volume in terms of the solid content.

When the adhesion promoting layer 20 contains metal oxide, the following effect is attained.

When the light-reflecting layer 14 is formed by physical vapor deposition on the surface of the polymer film, ions of elements (silicon, aluminum, or the like) forming the light-reflecting layer 14 infiltrate and are embedded in the polymer film from the interface. Therefore, the interface of the polymer film and the light-reflecting layer 14 is irregular, and the area of the interface is extraordinarily increased. As a result, the reflectance of incident light to the light-reflecting layer 14 from the surface of polymer film become lower than that for incident light to the surface of the light-reflecting layer 14 on the opposite side of the polymer film. Accordingly, a transparent hard metal oxide is disposed on the interface of the polymer film and the light-reflecting layer 14, and thus, infiltration and embedding of ions to the polymer film can be suppressed.

(d) A surface treatment is one where the surface of a polymer film is roughened, or actively reacted with a gas such as oxygen to form an oxygen complex such as a hydroxyl group, a ketone group, or highly reactive polar group such as an amine group.

A surface treatment may be a blast treatment, chemical conversion treatment, corona discharge treatment, ultraviolet treatment, electron beam treatment, plasma treatment, or the like.

Third Embodiment

Figure 4:
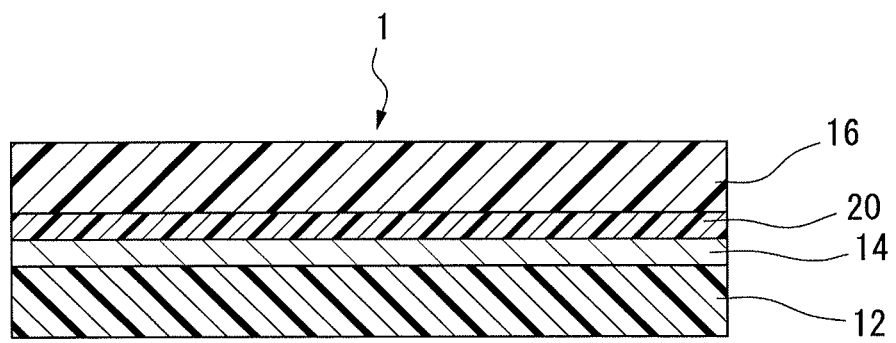
FIG. 4 is a cross-sectional view showing another example of the radio wave-transmitting decorative film of the invention.

FIG. 4 is a cross sectional view showing another example of the radio wave-transmitting decorative film of the invention. The decorative film 1 includes a first polymer film 12, a light-reflecting layer 14 provided on the surface of the first polymer film 12, an adhesion promoting layer 20 provided on the surface of the light-reflecting layer 14, and a second polymer film 16 provided on the surface of the adhesion promoting layer 20.

In the third embodiment, the same configurations as the first embodiment and the second embodiment have the same references, the description of which will be omitted.

Fourth Embodiment

Figure 5:
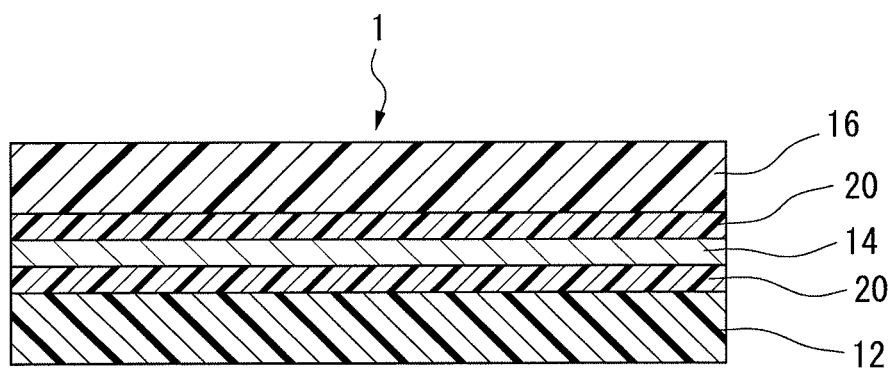
FIG. 5 is a cross-sectional view showing another example of the radio wave-transmitting decorative film of the invention.

FIG. 5 is a cross sectional view showing other examples of the radio wave-transmitting decorative film of the invention. The decorative film 1 includes a first polymer film 12, an adhesion promoting layer 20 provided on the surface of the first polymer film 12, a light-reflecting layer 14 provided on the surface of the adhesion promoting layer 20, an adhesion promoting layer 20 provided on the surface of the light-reflecting layer 14, and a second polymer film 16 provided on the surface of the adhesion promoting layer 20.

In the fourth embodiment, the same configurations as the first embodiment and the second embodiment have the same references, the description of which will be omitted.

Fifth Embodiment

Figure 6:
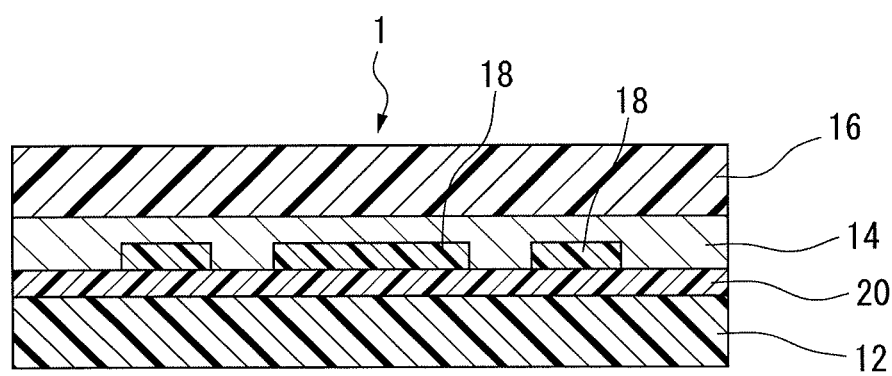
FIG. 6 is a cross-sectional view showing another example of the radio wave-transmitting decorative film of the invention.

FIG. 6 is a cross sectional view showing other examples of the radio wave-transmitting decorative film of the invention. The decorative film 1 includes a first polymer film 12, an adhesion promoting layer 20 provided on the surface of the first polymer film 12, a design portion 18 provided on a portion of the surface of the adhesion promoting layer 20, a light-reflecting layer 14 provided on the surface of the adhesion promoting layer 20 and the design portion 18, and a second polymer film 16 provided on the surface of the light-reflecting layer 14.

In the fifth embodiment, the same configurations as the first embodiment and the second embodiment have the same references, the description of which will be omitted.

Design Portion

Design portion 18 is a portion (character, symbol, figure, pattern, or the like) where materials with an occlusion property (optical non-transmissibility or optical low transmissibility) are placed and formed into a desirable pattern shape. When the decorative film 1 is viewed from first polymer film 12, a metallic gloss is formed as a background, and characters (Japanese characters, alphabet, numbers, and the like), symbols, or the like are depicted.

The design portion 18 can be formed by printing using a known printing ink or paint.

Sixth Embodiment

The decorative film 1 has a flat shape, however when a decorative member is produced using the film, it is required to make three-dimensional shape, and the decorative film 1 is partially stretched. The light-reflecting layer 14 is dependent on the shape of the decorative member, but cracking may occur unexpectedly which is observable visually and the external appearance is deteriorated depending on degree or direction of stretching.

Therefore, a number of nano-level irregular sites are previously provided in the light-reflecting layer 14, the adhesion promoting layer 20, or the polymer film, and the light-reflecting layer 14 is divided and broken by a portion where the irregular sites are provided when the decorative film 1 is stretched, and thus a crack large enough to be observed visually and deterioration of the external appearance can be suppressed.

The divided light-reflecting layer 14 can be recognized as gloss which is observed visually and thus the size is about 5 μm or less. The distance between the divided light-reflecting layers 14 is stretched and enlarged, it is recognized that reflectance is lowered, which is observed visually, and the light-reflecting layer become thin.

Examples of irregular sites include the following examples.

(α) An irregular site formed by hardening a portion of the light-reflecting layer 14.

(β) An irregular site which is formed in the polymer film or the adhesion promoting layer 20 and has a lower adhesion strength than therearound.

(γ) An irregular site which is formed in the adhesion promoting layer 20 and has a lower elastic modulus than therearound.

The irregular site of (α) is hard and brittle, and thus the light-reflecting layer 14 is divided and broken by the irregular site.

The irregular site of (β) has low adhesion strength between the polymer film and the light-reflecting layer 14, and thus when the decorative film 1 is stretched, the light-reflecting layer 14 cannot follow the stretching, and thus the light-reflecting layer 14 is divided and broken by the irregular site.

The irregular site of (γ) has a low elastic modulus of the adhesion promoting layer 20, and thus when the decorative film 1 is stretched, the adhesion promoting layer 20 is simultaneously stretched, the light-reflecting layer 14 cannot follow the stretching, and thus the light-reflecting layer 14 is divided and broken by the irregular site. On the other hand, the adhesion promoting layer 20 around the irregular site of (γ) has a high elastic modulus, and thus when the decorative film 1 is stretched, the adhesion promoting layer 20 is not stretched, and therefore the light-reflecting layer 14 is not divided and broken by the irregular site.

The irregular site of (α) can be formed by hardening a portion of silicon and a metal on the light-reflecting layer 14 at the nano level. For example, when an alloy of silicon and a metal is physically deposited on a substrate, a portion of the light-reflecting layer 14 is formed into ceramics by reacting gas containing a typical non-metallic element with silicon and a metal and thus can form an irregular site.

Examples of the typical non-metal element include nitrogen, carbon, oxygen, boron, phosphorus, and sulfur. From the viewpoint of easy handling of gas and the influence of reaction products, nitrogen, oxygen, and carbon are preferable. Examples of the nitrogen-containing gas include molecular nitrogen. Examples of the oxygen-containing gas include molecular oxygen. Examples of the carbon-containing gas include hydrocarbons.

A ceramics-forming degree is preferably 0.01 mol % to 10 mol % of the light-reflecting layer 14. When the ceramics-forming degree is less than 0.01 mol %, the number of irregular sites is insufficient and cracking easily occurs, which can be observed visually. When the ceramics-forming degree is more than 10 mol %, whiteness and transparency due to formation of ceramics are increased and an unsatisfactory level of metallic gloss easily occurs.

The ceramics-forming degree is dependent on the size of vacuum chamber and the deposition rate, but the flow rate of typical non-metal gas can be adjusted in the range of 0.1 to 50 sccm.

In plasma assisted deposition during physical vapor deposition, the surface of the polymer film can be subjected to a hydrophilic process by flowing oxygen or nitrogen, which is preferable from the viewpoint of adhesiveness.

Ceramics-forming analysis (confirmation of irregular site) can be performed by an X-ray diffraction apparatus.

For example, the irregular site of ($\beta$) and/or ($\gamma$) can be formed by (I) to (V).

(I) The adhesion promoting layer 20 is formed using (a) an adhesion promoter. In this case, a minute nucleus can be formed using a dry process as a basis.

For example, a monomer, oligomer or polymer having a polar group is heated and deposited, and thereby a minute portion which is formed of a resin having a polar group is homogeneously distributed, to form an irregular site of ($\beta$). At this time, the distribution density can be adjusted by changing the deposition amount.

Further, the surface of the polymer film is subjected to a surface treatment such as atmospheric plasma treatment or corona discharge treatment to introduce a polar group, and then an aqueous solution of a polar group-containing resin is thinly coated to bond the polar group-containing resin to a polar group of the surface of the polymer film by hydrogen bonding and the like, the polar group-containing resin is fixed, and thus a minute portion which is formed of the polar group-containing resin is distributed homogeneously to form an irregular site of ($\beta$).

A minute portion of crosslinked polyolefin which homogeneously distributes a hydrocarbon such as methane without a polar group by plasma polymerization and the like is formed on the surface of the polymer film, which is used as a mask, and the aqueous solution described above is coated to distribute a minute portion which is formed of the polar group-containing resin homogeneously, to form an irregular site of ($\beta$).

Moreover, in a case of silane coupling, a hydrophilic property is provided by a partial plasma process and the like or a lipophilic property is provided by chemical vapor deposition of crosslinked polyolefin, and then an aqueous silane coupling solution is coated, and a minute portion having partially high affinity is distributed homogeneously to form an irregular site of ($\beta$).

(II) The adhesion promoting layer 20 is formed using (b) the inorganic matter. In this case as well, a minute nucleus can be formed using a dry process as a basis.

For example, when inorganic matter is physically or chemically deposited, a minute portion formed of the inorganic matter is distributed homogeneously by controlling the density of the deposition amount. An adhesion strength difference between a portion of inorganic matter (metal oxide particles, or the like) and a portion (resin, or the like) around the inorganic matter occurs, and thus a minute portion having a high adhesion strength and a minute portion having a low adhesion strength are distributed homogeneously, to form an irregular site of ($\beta$). Moreover, an elastic modulus difference between a portion of inorganic matter (metal oxide particles, or the like) and a portion (resin, or the like) around the inorganic matter occurs, and thus a fine portion having a high elastic modulus and a minute portion having a low elastic modulus are distributed homogeneously, to form an irregular site of ($\gamma$) as well.

At this time, it is preferable that inorganic matter be adhered well to the polymer film. Examples of methods for improving the adhesive force between the inorganic matter and the polymer film include a surface treatment method on the surface of polymer film; a method where a bias voltage is applied so that the inorganic matter is accelerated to a high energy and hits the polymer film, in a case of forming fine inorganic matter by a physical or chemical vapor deposition; a method where DLC (diamond-like carbon) or silicon and the like-containing DLC and the like is formed by a PBII (plasma based ion implantation) method and the like, in a case of forming fine inorganic matter by a chemical polymerization method; and the like. In a case of a chemical polymerization method, adhesion density can be changed depending on polymerization conditions, and thus fine inorganic matter which is distributed homogeneously can be formed.

(III) The adhesion promoting layer 20 is formed using (c) a composite of an adhesion promoter and inorganic matter. In this case, a minute nucleus can be formed using a dry process as a basis. Specifically, this can be formed similarly to (II) or (III).

(IV) Having minute portion of different elastic modulus on the surface of the polymer film has the same effect as the adhesion promoting layer 20 formed by (III). For example, it may be a copolymer having a soft segment and a hard segment which can utilize a polymer film where the hard segment portion is microphase-separated as an island shape. Examples of the copolymer include polyester, polyolefin, a polyamide thermoplastic elastomer; a silicon polyimide copolymer, or the like.

(V) When the surface of the polymer film is subjected to (d) surface treatment to form the adhesion promoting layer 20, a minute portion having high adhesion strength and a minute portion having low adhesion strength are homogeneously distributed by controlling treatment strength to form an irregular site of ($\beta$).

Figure 7:
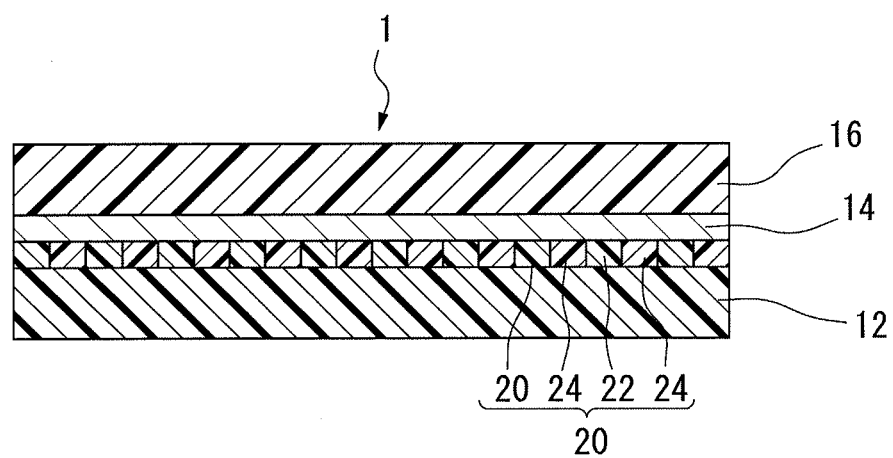
FIG. 7 is a cross-sectional view showing another example of the radio wave-transmitting decorative film of the invention.

FIG. 7 is a cross sectional view of decorative film 1 schematically showing a minute portion 22 having high adhesion strength or elastic modulus and a minute portion 24 (irregular site) having a low adhesion strength or elastic modulus which are alternately formed in adhesion promoting layer 20. When decorative film 1 is stretched, the light-reflecting layer 14 is subdivided by the portion 24 having low adhesion strength or elastic modulus.

Seventh Embodiment

Figure 8:
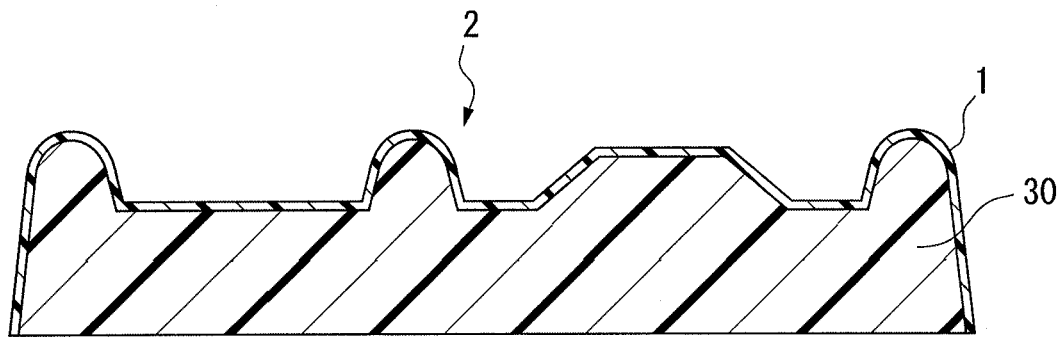
FIG. 8 is a cross-sectional view showing one example of the decorative member of the invention.

FIG. 8 is a cross sectional view showing one example of the decorative member of the invention. The decorative member 2 is one where a decorative film 1 is incorporated into the surface of a base 30 having a plurality of convex portions along a form of the base 30.

Base

A base 30 is a molded body of materials having radio wave transmissibility.

Examples of radio wave-transmitting materials include an insulating organic material. The term "insulating" means a surface resistivity of $10^6 \Omega$ or higher, and the surface resistivity is preferably $10^8 \Omega$ or higher. The surface resistivity of a substrate is measured by a four-pin probe method in accordance with JIS K7194. The material with radio wave transmissibility is preferably an insulating organic material from the viewpoint of molding processability.

Examples of the organic material include polyolefin (polyethylene, polypropylene, ethylene-propylene copolymer, ethylene-vinyl acetate copolymer, or the like), cyclic polyolefin, modified polyolefin, polyvinyl chloride, polyvinylidene chloride, polystyrene, polyamide (nylon 6, nylon 46, nylon 66, nylon 610, nylon 612, nylon 11, nylon 12, nylon 6-12, nylon 6-66, or the like), polyimide, polyamideimide, polycarbonate, poly-(4-methylpentene-1), an ionomer, an acrylic resin (polymethylmethacrylate, or the like), an ABS resin, an AS resin, a butadiene-styrene copolymer, polyoxymethylene, polyvinyl alcohol, an ethylene-vinyl alcohol copolymer, polyester (polyethylene terephthalate, polybutylene terephthalate, polycyclohexane terephthalate, or the like), polyether, polyether ketone, polyether ether ketone, polyether imide, polyacetal, polyphenylene oxide, modified polyphenylene oxide, polysulfone, polyether sulfone, polyphenylene sulfide, polyarylate, aromatic polyester (liquid crystal polymer), polytetrafluoroethylene, polyvinylidene fluoride, other fluorine-based resins, and thermoplastic elastomers (a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, a chlorinated polyethylene-based elastomer, or the like), an epoxy resin, a phenolic resin, a urea resin, a melamine resin, unsaturated polyester, a silicone-based resin, a urethane-based resin, a polyparaxylylene resin, natural rubber, polybutadiene rubber, polyisoprene rubber, acrylonitrile-butadiene copolymer rubber, styrene-butadiene copolymer rubber, styrene-isoprene copolymer rubber, styrene-butadiene-isoprene copolymer rubber, a hydrogenated product of diene-based rubber, saturated polyolefin rubber (ethylene-α-olefin copolymers such as an ethylene-propylene copolymer), an ethylene-propylene-diene copolymer, an α-olefin-diene copolymer, urethane rubber, silicone rubber, polyether-based rubber, and acrylic rubber.

One type of these organic materials may be used alone, or two or more types thereof may be combined and used as a copolymer, a blended product, a polymer alloy, a laminated body, or the like.

These organic materials may contain an additive if necessary. Examples of the additive include a strengthening agent, an antioxidant, an ultraviolet absorber, a lubricant, an anti-clouding agent, anti-fogging agent/misting agent, a plasticizer, a pigment, a near infrared absorber, an antistatic agent, and a colorant, and the like.

A decorative member 2 can be produced by forming a decorative film 1 into a desirable shape, then setting in a mold having the same shape, and injecting a liquid resin from an opening portion of the mold to form incorporated matter. A polymer film of the base 30 side of the decorative film 1 may use the same resins as the base 30 and attain good adhesiveness (not shown).

Each corner portion of convex portion of the base 30 is particularly stretched, and a light-reflecting layer in the decorative film 1 is subdivided into many minute portions (not shown).

Eighth Embodiment

Figure 9:
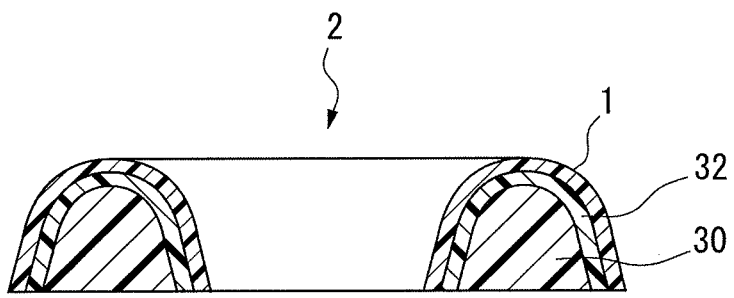
FIG. 9 is a cross-sectional view showing another example of the decorative member of the invention.

FIG. 9 is a cross-sectional view showing another example of a decorative member of the invention. The decorative member 2 of decorative film 1 is incorporated into the surface of base 30 having a doughnut-like shape, along a form of the base 30.

The heated decorated film 1 using an adhesive film 32 is incorporated into the base 30 formed above.

In the eighth embodiment, the same configuration as the seventh embodiment has the same references, the description of which will be omitted.

Each corner portion of convex portion of the base 30 is particularly stretched, and a light-reflecting layer in the decorative film 1 is subdivided into many minute portions (not shown).

The decorative film of the invention and decorative member using the same described above is formed by a physical vapor deposition of an alloy of silicon and a metal and has a bright light-reflecting layer with high reflectance, and therefore it has radio wave transmissibility and the same metallic gloss as chromium plating.

Moreover, since an alloy of silicon and a metal which is chemically stable in comparison to indium and tin and the like are used, the loss of metallic gloss is less likely to occur over time. In addition, the light-reflecting layer is protected with the polymer film, and the loss of metallic gloss is less likely to occur.

Moreover, because an alloy composed of silicon and a metal is used which is cheaper than rare metal simple substances such as indium, the production cost is low. In addition, the number of laminations of decorative film is small, and thus the production cost is low.

Moreover, since the light-reflecting layer is sandwiched between two polymer films, the decorative film has excellent stretch moldability, and the decorative member using the same has excellent external appearance property in the corner portion.

Further, in a case of the light-reflecting layer, the adhesion promoting layer or the polymer film has a number of irregular sites, stretch moldability of the decorative film is increased, and the decorative member using the same has an improved external appearance property at the corner portion.

Further, since the conductive metal element is fixed by semi-conductive silicon to the light-reflecting layer, performance of radio wave transmissibility without partially connecting islands such as indium with each other, which has been found in a decorative member using conventional decorative film due to the pressure and the like in molding does not need to be examined, and has high productivity.

The reason why an alloy containing a semiconductor material such as silicon allows radio waves to pass therethrough and exhibits metallic gloss is thought to be as follows.

The presence of free electrons that characterizes metals brings electrical conductivity. Moreover, when an electromagnetic wave (such as light and radio waves) is about to enter into a metal, free electrons travel to cause a strong electronic polarization, thereby inducing electric fluxes that counteract the electric field of the electromagnetic wave entering. Accordingly, this it makes it difficult for the electromagnetic wave to enter into the metal, as a result of which the electromagnetic wave is reflected without being allowed to pass therethrough. Furthermore, because the alloy exhibits high reflectance in the visible light region, the reflected light is observed as metallic gloss.

On the other hand, in the case of a semiconductor material, only a limited number of free electrons are present, and thus, unlike the case of a metal, radio waves are allowed to pass therethrough without being reflected. The metallic gloss is thought to be caused, not by the presence of free electrons, but by the presence of strong absorption in the visible light region due to the direct transition between the bands, thereby inducing a strong electronic polarization, as a result of which the semiconductor material exhibits a high refractive index and thus a high reflectance.

In addition, in the invention, the reason why an alloy composed of silicon and a metal is used is as follows.

Although silicon exhibits a high reflectance in the visible light region, it is lower than the reflectance of metals (for example, 98% reflectance for silver and 90% reflectance for aluminum at a wavelength of 620 nm, according to the value described in "Handbook of Optical Constants of Solids", edited by E. L. Palik (Academic Press, 1985)), which is 36% (at a wavelength of 620 nm, according to the value described in the Handbook). For this reason, by alloying silicon with a metal having a reflectance of 50% or higher, the reflectance can be improved and the brightness can be enhanced, thereby obtaining a light-reflecting layer exhibiting metallic gloss equal to or greater than bright chromium plating. In addition, because the metal is soft compared to silicon, internal stress of the light-reflecting layer is reduced, thereby improving the adhesiveness thereof and suppressing the occurrence of cracks.

EXAMPLES

Radio Wave Transmissibility

By using a coaxial-tube type, shielding effect measuring system (manufactured by Keycom Corporation under the trade name of S-39D, in accordance with ASTM D4935), a flat disk-shaped sample was placed inside the coaxial tube having an outer body with an inner diameter of 39 mm, and the amounts of transmission attenuation (S21) and reflection attenuation (S11) were measured using a vector network analyzer (manufactured by Anritsu Corporation under the trade name of 37247C) connected to both ends of the coaxial tube. As the amount of transmission attenuation approached 0 dB, the superior the radio wave transmissibility became.

Reflectance

The term "reflectance" refers to the diffuse reflectance including the regular reflectance which is measured in accordance with Condition d (n-D) of JIS Z 8772. The reflectance was measured including the regular reflection light of a gloss component using an integrating sphere.

More specifically, the reflectance of a decorative member was measured including the regular reflection light of gloss component using an integrating sphere, by use of an ultraviolet visible near infrared spectrophotometer (manufactured by JASCO Corporation under the trade name of V-570). An average of the values collected from 401 points of measurement that were present across a region ranging from a wavelength of 380 nm to 780 nm was then determined.

Transmissibility

The transmissibility of a decorative member was measured, by the use of an integrating sphere, using an ultraviolet visible near infrared spectrophotometer (manufactured by JASCO Corporation under the trade name of V-570).

Thickness of Light-Reflecting Layer

The thickness of a light-reflecting layer was measured at five points by observing a cross section of the light-reflecting layer using a transmission electron microscope (manufactured by JEOL Ltd., under the trade name of JEM-4000EX), and the measured values were averaged.

Average Surface Roughness

The average surface roughness (arithmetic average roughness Ra) was determined by scanning 1 $\mu m^2$ of the surface of a sample using a scanning probe microscope (manufactured by SII NanoTechnology Inc. under the trade name of SPA400) with DFM mode of atomic force microscope, followed by the production of an image of the surface profile. It was measured immediately after forming a light-reflecting layer.

Surface Resistivity

The surface resistivity of a sample was measured by placing a series 4-pin probe (ASP) on top of a sample using a resistivity meter (Loresta GP, Model MCP-T600, manufactured by Dia Instruments Co., Ltd., in accordance with JIS K7194). The measurement voltage was set to 10 V. It was measured immediately after forming a light-reflecting layer.

Elastic Modulus

An Elastic modulus difference of a minute portion on the surface of the adhesion promoting layer or the polymer film was determined as follows.

A viscoelastic distribution on the surface of the adhesion promoting layer or the polymer film from flexural oscillation of a perceiving lever was imaged and an elastic modulus difference of a minute portion was observed using a scanning probe microscope (manufactured by SII NanoTechnology Inc. under the trade name of SPA400) with a micro-viscoelastic measuring mode.

SEM Image

The surface of the light-reflecting layer was observed using an electron scanning microscope (manufactured by JASCO Corporation under the trade name of JSM6390LV). Since making the surface of the sample conductive and a grounding process were not performed, the decorative film was largely stretched, and a portion where resistance of light-reflecting layer was increased could not be imaged.

Example 1

The surface of acryl film, as a first polymer film 12, having a thickness of 50 µm, was subjected to physical vapor deposition using a DC sputtering apparatus with the following target to form a light-reflecting layer 14.

An alloy composed of silicon and aluminum which was doped with boron (aluminum proportion: 60 volume %, amount of doped boron: approximately $10^{-7}$ mol %) was used as the target. The reflectance of the elemental form of aluminum is 87.6%.

Then, acryl film, as a second polymer film 16, having a thickness of 50 µm, was subjected to thermal lamination on the surface of the light-reflecting layer 14 to obtain a decorative film 1 shown in FIG. 1.

Figure 10:
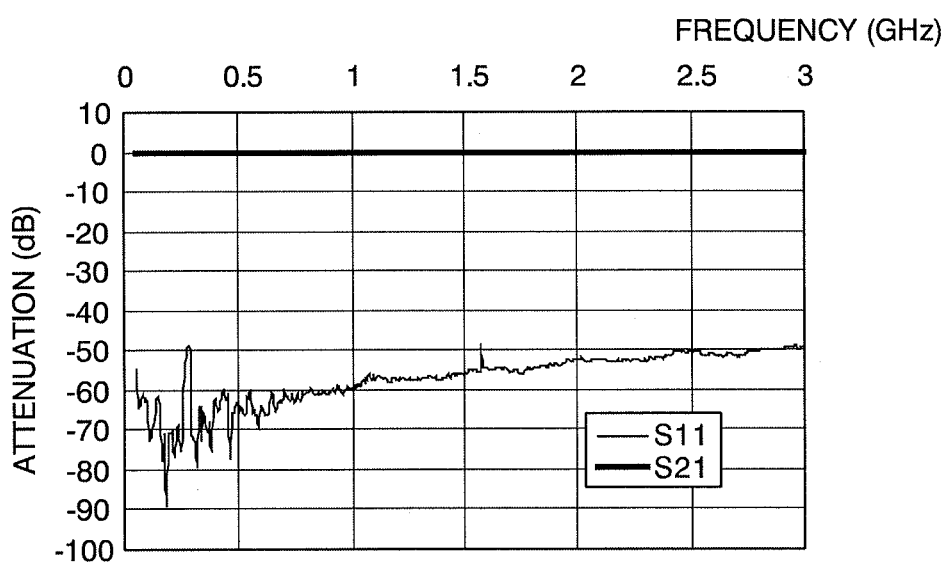
FIG. 10 shows a graph indicating an amount of transmission attenuation (S21) and an amount of reflection attenuation (S11) of radio waves transmitting through the decorative film obtained in Example 1.
Figure 11:
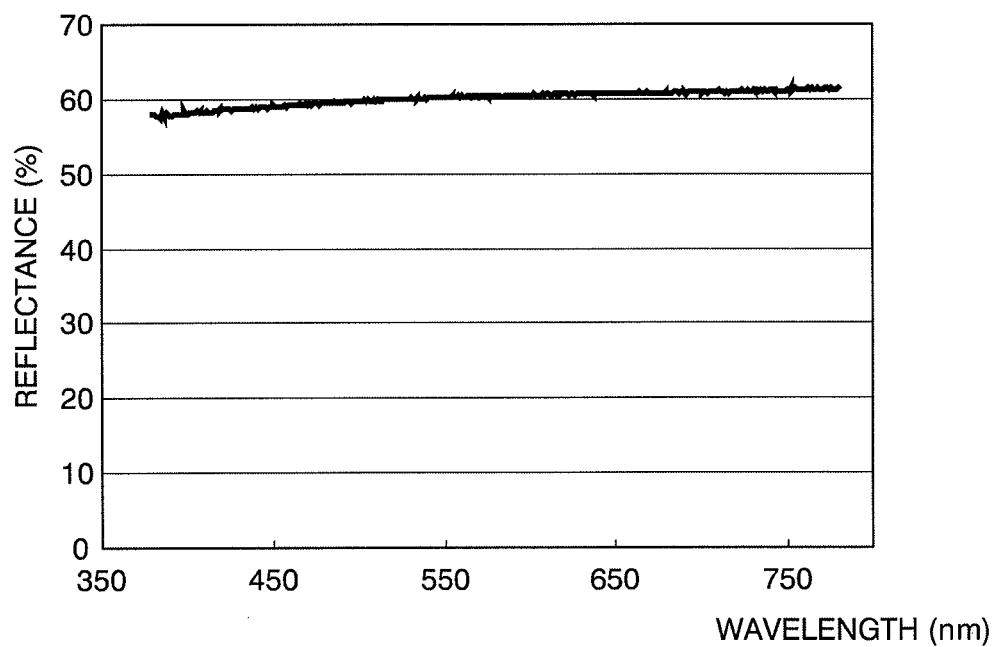
FIG. 11 shows a graph indicating the reflectance of visible light of the decorative film obtained in Example 1.
Figure 12:
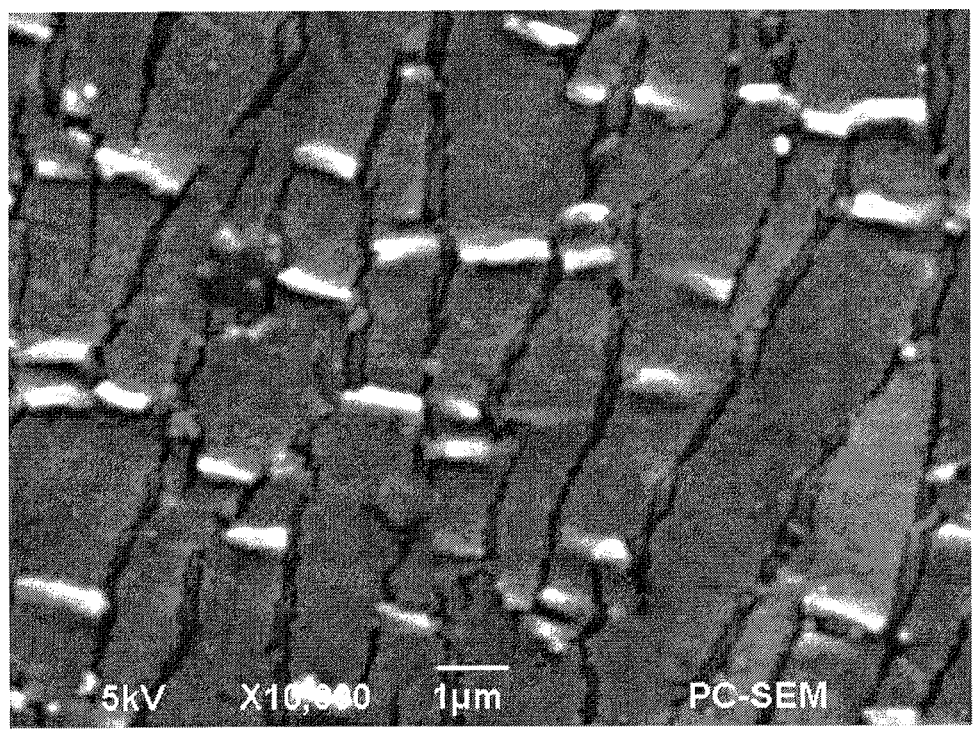
FIG. 12 is a SEM image of the surface of the light-reflecting layer of the decorative film obtained in Example 1.

With respect to the obtained decorative film 1, the thickness of the light-reflecting layer 14, the amounts of transmission attenuation (S21) at 1 GHz and 3 GHz, the reflectance of visible light entered from first polymer film 12, the surface resistivity, and the average surface roughness were measured. In addition, the external appearance of the decorative film 1 was observed. Moreover, the proportion of aluminum in the light-reflecting layer 14 was the same as the proportion of aluminum in the target. The results are shown in Table 1. Moreover, a graph indicating the amount of transmission attenuation (S21) and amount of reflection attenuation (S11) of radio waves of the radio wave-transmitting decorative film 1 is shown in FIG. 10. Furthermore, a graph indicating the reflectance of the decorative film 1 is shown in FIG. 11. In addition, a SEM image (FIG. 12) of the surface of light-reflecting layer 14 when the decorative film 1 was stretched to one direction and returned to the original length was observed. Thereby, it was divided into light-reflecting layers having a width of about 1 µm in a stretching direction.

Comparative Example 1

A decorative film was observed in a manner similar to Example 1, except that elemental silicon was used as the target.

With respect to the obtained decorative film, the thickness of the light-reflecting layer, the amounts of transmission attenuation (S21) at 1 GHz and 3 GHz, the reflectance, the surface resistivity, and the average surface roughness were measured. In addition, the external appearance of the decorative film was observed. The results are shown in Table 1.

Example 2

The surface of polycarbonate film having a thickness of 100 μm as a first polymer film 12 was subjected to physical vapor deposition at a flow of nitrogen gas of 0.5 sccm, to form a light-reflecting layer 14 of which a portion was formed into ceramics, using a DC sputtering apparatus with the same target as Example 1.

Then, a polyolefin chloride layer was laminated on the surface of black ABS film having a thickness of 100 μm as a second polymer film 16 and the polyolefin chloride layer was used as an adhesive, which was adhered to light-reflecting layer 14 to obtain a decorative film 1.

With respect to the obtained decorative film 1, the thickness of the light-reflecting layer 14, the amounts of transmission attenuation (S21) at 1 GHz and 3 GHz, the reflectance, the surface resistivity, and the average surface roughness were measured. In addition, the external appearance of the decorative film 1 was observed. The results are shown in Table 1.

The decorative film 1 was made as a preform in a mold, ABS resin was injected into a mold, and decorative film 1 and base 30 were incorporated as shown in FIG. 8 to obtain a decorative member 2. The external appearance of the decorative member 2, in particular, the metallic gloss of the corner portion of a convex portion was observed. The result is shown in Table 1.

Example 3

A laminate of a copolymerizable polyester film (manufactured by Toyobo Co., Ltd., trade name Softshine) having a thickness of 25 μm and an acryl film having a thickness of 50 μm was prepared as a first polymer film 12.

On the surface of the copolymerizable polyester film, oxygen plasma processing was performed under conditions of power: 500 W, time: 2 minutes, reaching vacuum degree: $6 \times 10^{-1}$ Pa, oxygen flow rate: 15 sccm.

On the surface treated with plasma, physical vapor deposition was performed using an alloy (aluminum proportion: 70 volume %) of silicon and aluminum by a DC sputtering apparatus as a target, to form a light-reflecting layer 14.

Black ABS film was adhered in a manner similar to Example 2, to obtain a decorative film 1.

With respect to the obtained decorative film 1, the thickness of the light-reflecting layer 14, the amounts of transmission attenuation (S21) at 1 GHz and 3 GHz, the reflectance, the surface resistivity, and the average surface roughness were measured. In addition, the external appearance of the decorative film 1 was observed. The results are shown in Table 1.

The decorative film 1 was made as a preform in a mold, ABS resin was injected into a mold, and decorative film 1 and base 30 were incorporated as shown in FIG. 8 to obtain a decorative member 2. The external appearance of the decorative member 2, in particular, the metallic gloss of the corner portion of a convex portion was observed. The result is shown in Table 1.

Example 4

A polyester thermoplastic elastomer film (manufactured by Toray corporation, trade name Hytrel, using aromatic polyester as a hard segment and polyetherester as a soft segment) having a thickness of 125 μm was prepared as a first polymer film. The elastic modulus of the surface of the film was measured, and a minute portion having a high elastic modulus and a minute portion (irregular site) having a low elastic modulus were distributed homogeneously, which was confirmed.

The surface of the film was subjected to an oxygen plasma process in a manner similar to Example 3.

On the surface treated with plasma, physical vapor deposition was performed using an alloy (aluminum proportion: 65 volume %) of silicon and aluminum by a DC sputtering apparatus as a target, to form a light-reflecting layer 14.

Figure 13:
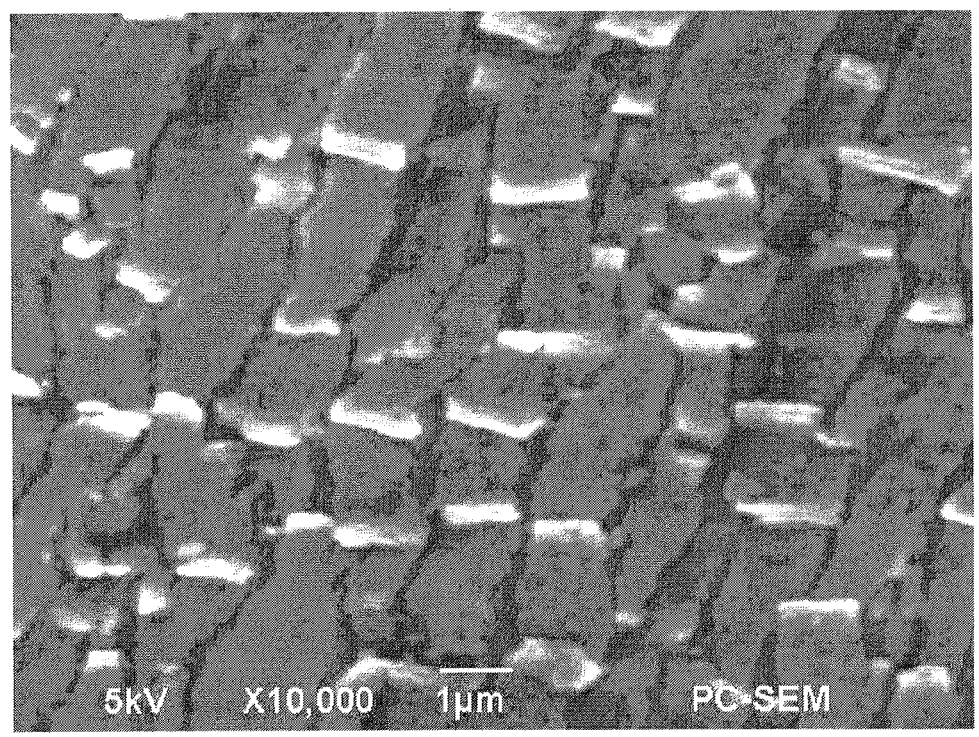
FIG. 13 is a SEM image of the surface of the light-reflecting layer of the decorative film obtained in Example 4.

Then, transparent polyolefin chloride layer was laminated on the surface of transparent polycarbonate film having a thickness of 50 μm as a second polymer film, and the polyolefin chloride was used as an adhesive, which was adhered to light-reflecting layer 14 to obtain a decorative film 1. Further, a SEM image of the surface of light-reflecting layer 14 when decorative film 1 was stretched to 100% and returned to the original length was observed (FIG. 13). Thereby it was divided into light-reflecting layers having a width of about 1 μm in a stretching direction.

With respect to the obtained decorative film 1, the thickness of the light-reflecting layer 14, the amounts of transmission attenuation (S21) at 1 GHz and 3 GHz, the reflectance, the surface resistivity, and the average surface roughness were measured. In addition, the external appearance of the decorative film 1 was observed. The results are shown in Table 2.

As shown in FIG. 9, the decorative film 1 was incorporated into a base 30 formed of polybutylene terephthalate by pressure molding using a polyolefin chloride layer provided for the first polymer film 12 side of the decorative film 1 as an adhesive to obtain a decorative member 2. The external appearance of the decorative member 2, in particular, the metallic gloss of the corner portion of a convex portion was observed. The result is shown in Table 2.

Example 5

A laminate of a copolymerizable polyester film (manufactured by Toyobo Co., Ltd., trade name Softshine) having a thickness of 25 μm and a polycarbonate film having a thickness of 50 μm were prepared as a first polymer film.

On the surface of the copolymerizable polyester film, chemical vapor deposition was performed using silicon-containing DLC in PBII apparatus (manufactured by Cupkurita Corporation), and a number of hard minute portions were formed to set as an adhesion promoting layer 20. Further, oxygen plasma processing was performed under conditions of power: 250 W, time: 1 minute, reaching vacuum degree: $6 \times 10^{-1}$ Pa, oxygen flow rate: 15 sccm. The elastic modulus of the surface of the adhesion promoting layer 20 was measured, and a minute portion having a high elastic modulus and a minute portion (irregular site) having a low elastic modulus were distributed homogeneously, which was confirmed.

On the surface treated with plasma, physical vapor deposition was performed using an alloy (aluminum proportion: 55 volume %) of silicon and aluminum by a DC sputtering apparatus as a target, to form a light-reflecting layer 14.

Black ABS film was adhered in a manner similar to Example 2, to obtain a decorative film 1.

With respect to the obtained decorative film 1, the thickness of the light-reflecting layer 14, the amounts of transmission attenuation (S21) at 1 GHz and 3 GHz, the reflectance, the surface resistivity, and the average surface roughness were measured. In addition, the external appearance of the decorative film 1 was observed. The results are shown in Table 2.

As shown in FIG. 9, the decorative film 1 was incorporated into a base 30 formed of ABS resin by pressure molding to obtain a decorative member 2 using a polyolefin chloride layer provided for the first polymer film 12 of decorative film 1 as an adhesive to obtain a decorative member 2. The external appearance of the decorative member 2, in particular, the metallic gloss of the corner portion of a convex portion was observed. The result is shown in Table 2.

TABLE 1

|  | Example 1 | Example 2 | Example 3 | Comparative Example 1 |
|---|---|---|---|---|
| Thickness of the light-reflecting layer (nm) | 100 | 75 | 100 | 100 |
| Average surface roughness of the light-reflecting layer (nm) | 2.2 | 1.8 | 2.1 | 2.3 |
| Amount of transmission attenuation (dB) | | | | |
| 1 GHz | 0.0 | 0.0 | 0.0 | 0.0 |
| 3 GHz | 0.0 | 0.0 | 0.1 | 0.0 |
| Reflectance (%) | | | | |
| 400 nm | 58.0 | 57.2 | 63.2 | 47.4 |
| 500 nm | 59.7 | 57.5 | 63.0 | 40.9 |
| 600 nm | 60.5 | 58.7 | 62.7 | 53.0 |
| 700 nm | 61.0 | 58.2 | 62.8 | 43.3 |
| Average value | 59.8 | 57.9 | 62.9 | 43.8 |
| Surface resistivity (Ω) | $10^8$ or more | $10^8$ or more | $10^8$ or more | $10^8$ or more |
| External appearance of decorative film | Metallic gloss | Metallic gloss | Metallic gloss | Slight red black Metallic gloss and dark. When it is bent, fine cracks occur. |
| External appearance of decorative member | | Stretched portion has an observable thin metallic luster, but significant change is not shown. | Stretched portion has an observable thin metallic luster, but significant change is not shown. | |

TABLE 2

|  | Example 4 | Example 5 |
|---|---|---|
| Thickness of the light-reflecting layer (nm) | 75 | 150 |
| Average surface roughness of the light-reflecting layer (nm) | 2.3 | 1.9 |
| Amount of transmission attenuation (dB) | | |
| 1 GHz | 0.0 | 0.0 |
| 3 GHz | 0.0 | 0.1 |
| Reflectance (%) | | |
| 400 nm | 58.1 | 57.6 |
| 500 nm | 59.7 | 57.9 |
| 600 nm | 60.6 | 58.2 |
| 700 nm | 61.2 | 58.4 |
| Average value | 59.9 | 58.0 |
| Surface Resistivity (Ω) | $10^8$ or more | $10^8$ or more |
| External appearance of decorative film | Metallic gloss | Metallic gloss |
| External appearance of decorative member | In metallic luster, significant change is not shown. | In metallic luster, significant change is not shown. |

INDUSTRIAL APPLICABILITY

The invention is useful as metallic luster of decorative members, in particular, a decorative film using the same used in the casing of a mobile phone; the button of a switch; the casing of a watch; and the radiator grill, bumper, panel or the like of a vehicle.

REFERENCE SINGS LIST

1 DECORATIVE FILM
2 DECORATIVE MEMBER
12 FIRST POLYMER FILM
14 LIGHT-REFLECTING LAYER
16 SECOND POLYMER FILM
18 DESIGN PORTION
20 ADHESION PROMOTING LAYER
22 MINUTE PORTION HAVING HIGH ADHESION STRENGTH OR ELASTIC MODULUS

24 MINUTE PORTION HAVING LOW ADHESION STRENGTH OR ELASTIC MODULUS (IRREGULAR SITE)
30 SUBSTRATE
32 ADHESIVE FILM

The invention claimed is:

1. A radio wave-transmitting decorative film, comprising:
a first polymer film;
a second polymer film;
a light-reflecting layer which is arranged between the first polymer film and the second polymer film, is in direct contact with the first polymer film, is formed by physical vapor deposition of an alloy of silicon and a metal, and comprises irregular sites comprising ceramics portions of the light-reflecting layer and formed during the physical vapor deposition by reaction a gas containing a typical non-metallic element with the alloy of the silicon and the metal;
an adhesion promoting layer positioned directly between the light-reflecting layer and the second polymer film,
wherein the light reflecting layer is divided and broken at a portion where the irregular sited are provided when the radio wave-transmitting decorative film is stretched.

2. The radio wave-transmitting decorative film according to claim 1, wherein the metal has a larger reflectance than that of silicon.

3. The radio wave-transmitting decorative film according to claim 1, wherein the metal is aluminum.

4. A decorative member, comprising the radio wave-transmitting decorative film according to claim 1 on the surface of a base.

5. The decorative member according to claim 4, wherein the first polymer film is positioned on a base side, wherein the first polymer film and the base comprise the same resin.

6. The radio wave-transmitting decorative film according to claim 1, wherein the radio wave-transmitting decorative film is stretch-moldable.

7. The radio wave-transmitting decorative film according to claim 1, wherein a thickness of the first polymer film is 10 to 100 μm.

8. The radio wave-transmitting decorative film according to claim 1, wherein a thickness of the light-reflecting layer is 10 to 500 nm.

9. The radio wave-transmitting decorative film according to claim 1, wherein a surface resistivity of the light-reflecting layer is $10^3 \Omega$ or higher.

10. The radio wave-transmitting decorative film according to claim 1, wherein an average surface roughness of the light-reflecting layer is 0.05 μm or less.

11. The radio wave-transmitting decorative film according to claim 1, wherein an average surface roughness of the first polymer film is 0.5 μm or less.

12. The radio wave-transmitting decorative film according to claim 1, wherein the proportion of the metal within the alloy is within a range from 0.1 to 70% volume %, with respect to 100 volume % of the alloy.

13. The radio wave-transmitting decorative film according to claim 1, wherein a ceramics-forming degree is 0.01 to 10 mol % of the light-reflecting layer.

14. The radio wave-transmitting decorative film according to claim 1, wherein the light-reflecting layer is formed with a flow rate of the gas containing the typical non-metallic element in a range of 0.1 to 50 sccm.

* * * * *